(12) United States Patent
Irie

(10) Patent No.: US 7,435,915 B2
(45) Date of Patent: Oct. 14, 2008

(54) JOINING STRUCTURE

(75) Inventor: Masaru Irie, Date (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/228,993

(22) Filed: Sep. 16, 2005

(65) Prior Publication Data

US 2006/0189210 A1 Aug. 24, 2006

Related U.S. Application Data

(63) Continuation of application No. PCT/JP03/03223, filed on Mar. 18, 2003.

(51) Int. Cl.
*H05K 9/00* (2006.01)
(52) U.S. Cl. .................. 174/369; 174/377; 361/816
(58) Field of Classification Search ................ 174/366, 174/369, 377, 382; 361/816, 818, 800
See application file for complete search history.

(56) References Cited

U.S. PATENT DOCUMENTS

| | | | |
|---|---|---|---|
| 5,777,854 A * | 7/1998 | Welch et al. ................ 361/800 |
| 5,917,710 A * | 6/1999 | Maatta ........................ 361/818 |
| 6,000,767 A * | 12/1999 | Liu et al. .................. 312/223.2 |
| 6,837,554 B2 * | 1/2005 | Yamamoto et al. ........ 312/223.2 |

FOREIGN PATENT DOCUMENTS

| | | |
|---|---|---|
| EP | 0 952 765 | 10/1999 |
| EP | 1 231 827 | 8/2002 |
| JP | 2-100398 | 4/1990 |
| JP | 9-283191 | 10/1997 |
| JP | 3065107 | 10/1999 |
| JP | 2001-284875 | 10/2001 |
| WO | WO 01/76341 | 10/2001 |

OTHER PUBLICATIONS

Abstract for JP 9-283191 Published Oct. 31, 1997.*

* cited by examiner

*Primary Examiner*—Hung V Ngo
(74) *Attorney, Agent, or Firm*—Greer, Burns & Crain, Ltd.

(57) ABSTRACT

The present invention relates to a joining structure at a joining portion of a couple of members. A belt type flat surface portion (11) provided to one member (10) and an opposing flat surface portion (21) provided to the other member (20) are joined with each other via a plurality of plate springs (14) allocated along the longitudinal direction of the belt type flat surface portion. Here, a plurality of plate springs are directed diagonally to the longitudinal direction of the belt type flat surface portion. Accordingly, the plate springs can be allocated with higher space efficiency and moreover close contact can be improved and reduction in cost can also be realized.

14 Claims, 4 Drawing Sheets

JOINING STRUCTURE

This is continuation of PCT International Application No. PCT/JP2003/003223 filed Mar. 18, 2003.

TECHNICAL FIELD

The present invention relates to a joining structure of members and particularly to a joining structure which can be suitably used for electromagnetic shield at the joining portion of an electronic device housing having conductivity.

BACKGROUND ART

In general, a housing of an electronic device is formed of a plurality of metal plates for simplifying assembling and maintenance thereof. On the other hand, the electronic device must be electromagnetically shielded to cause no adverse effects on peripheral devices due to electromagnetic waves generated from the electronic device and also not to allow malfunction of the electronic device due to any external electromagnetic waves. Therefore, in view of preventing leak and entry of an electromagnetic wave from the joining portion of metal plates forming the housing, an electromagnetic wave shielding structure is required at the relevant joining portion.

As an example of the electromagnetic shielding structure at the joining portion, the JP-A No. 2001-284875 and the registered Japanese Utility Model No. 3065107 disclose a structure in which a plurality of tongue pieces having the spring property are provided to metal plates and the metal plates are bonded through these tongue pieces as the conductive part.

The electromagnetic shielding structure of the background art will be explained with reference to FIG. 6 to FIG. 9. FIGS. 6 and 7 are de-assembled perspective views of the housing including the electromagnetic shielding structure of the background art. In FIGS. 6 and 7, the housing 500 is formed by assembling a ceiling plate 50 closing an aperture to the housing body 40 of the housing having the almost U-shape cross-section having an aperture at the upper part. At the circumference part of the aperture of the housing body 40, belt type flat portions 41 are formed to receive the ceiling plate 50. These belt type flat portions 41 are provided with a plurality of plate springs 44 where the relevant belt type flat part 41 is cut and erected along the longitudinal direction of the relevant belt type flat portions 41. The housing body 40 and the ceiling plate 50 are bonded with each other via a plurality of plate springs 44. With the structure as explained above, the housing body 40 and the ceiling plate 50 are conductive via a plurality of plate springs 44 and thereby leak and entry of the electromagnetic wave are prevented at the joining portion. Here, direction of each plate spring 44 becomes parallel for the longitudinal direction of the belt type flat portions 41 in FIG. 6 and also becomes vertical for the longitudinal direction of the belt type flat portions 41 in FIG. 7. FIGS. 8 and 9 illustrate respectively a part D1 in FIG. 6 and a partially enlarged diagram of a part D2 in FIG. 7. As illustrated in FIG. 8 and FIG. 9, in the electromagnetic shielding structure of the background art, each plate spring 44 is provided in any of the parallel direction or vertical direction for the longitudinal direction of the belt type flat portion 41.

Following requirements are generated for such electromagnetic shielding structure.

In recent years, with improvement in the operation rate of a computer, the frequency of the electromagnetic wave generated by an electronic device is increasing. Here, in view of shielding the electromagnetic wave of higher frequency, an interval between the contact points of the plate spring 44 and ceiling plate 50 (size c1 in FIG. 8 and size c2 in FIG. 9) must be further shortened. Accordingly, request for shortening the intervals (hereinafter referred to as contact interval c1, c2 between the plate spring 44 and ceiling plate 50 is also increasing.

Moreover, the plate spring itself is requested to have higher elasticity in order to improve the shielding performance by surely making conductive the housing body 40 and ceiling plate 50. In order to attain elasticity of the plate spring itself, length of the plate spring itself (size b1 in FIG. 8 and size b2 in FIG. 9) must be further elongated. Namely, it is also requested to make longer the length of the plate spring itself (hereinafter, referred to as plate spring length) b1, b2.

Moreover, it is also requested to make smaller the area of the joining portion between the housing body 40 and ceiling plate 50, namely to make narrower the width of belt type flat portion 14 (size a1, in FIG. 8 and size a2 in FIG. 9) in order to realize cost reduction and size reduction of the housing 500.

As explained above, three requirements are issued for the electromagnetic shielding structure. However, these three requirements are not simultaneously satisfied in the electromagnetic shielding structure of the background art. In more practical, when the plate spring length b1 is elongated in order to enhance elasticity of the plate spring 44 in the electromagnetic shielding structure of FIG. 8, the contact interval c1 must also be elongated, resulting in lowering of the shielding performance for the high frequency electromagnetic wave. The reasons are that it is impossible to make the contact interval c1 equal to or shorter than the plate spring length b1 and if only the plate spring length b1 is elongated without elongation of the contact interval c1, strength of the housing 500 is remarkably lowered. Moreover, when the plate spring length b2 is elongated to enhance elasticity of the plate spring 44 in the electromagnetic shielding structure of FIG. 9, the width a2 of the belt type flat portion 41 must also be elongated, resulting in increase in size and cost of the housing 500.

Requirements for structures illustrated in FIG. 6 to FIG. 9 have been explained from the viewpoint of the electromagnetic shielding function, but the following requirements are also generated when the structures illustrated in FIGS. 6 to 9 are considered as the joining structure.

First, it is desirable for improvement in close contact between the housing body 40 and ceiling plate 50 to make dense distribution of a plurality of plate springs 44 for the longitudinal direction of the belt type flat portion 41. Namely, requirement for making shorter the contact intervals c1, c2 is also generated in FIG. 8 and FIG. 9.

Moreover, the plate spring 44 itself should desirably have higher elasticity in order to improvement in the close contact. Namely, it is also required to make longer the plate spring length b1, b2 in FIG. 8 and FIG. 9.

Moreover, in order to realize reduction of cost of the housing 500, a request for reducing the area of the joining portion of the housing body 40 and ceiling plate 50, namely a request for making narrower the width (size a1 in FIG. 8 and size a2 in FIG. 9) of the belt type flat portion 41 is issued.

As explained above, three requirements are generated for the contact structures illustrated in FIG. 6 to FIG. 9. However in the joining structure of the background art, these requirements cannot be satisfied simultaneously. In more practical, when plate spring length b1 is elongated in order to enhance elasticity of the plate spring 44 in FIG. 8, the contact interval c1 must also be elongated, resulting in the result that distribution of a plurality of plate springs 44 becomes coarse. Moreover, in FIG. 9, when the plate spring length b2 is elongated in order to enhance elasticity of the plate spring 44, the width a2 of the belt type flat portion 41 must also be elongated, resulting in rise of cost or the like.

DISCLOSURE OF THE INVENTION

The present invention has been proposed by taking the background explained above into consideration and it is therefore an object of the present invention to provide a joining structure which can respond to at least a requirement without opposition to the other requirements among the three requirements that distribution of a plurality of plate springs becomes dense in the longitudinal direction of the belt type flat surface portion, the plate spring itself has higher elasticity, and reduction in cost is realized. Moreover, it is also another object of the present invention to provide a joining structure which can respond to at least a requirement without opposition to the other requirements among the three requirements that shield performance for high frequency electromagnetic wave is improved, reliability in conductivity among the conductive members are also improved, and reduction in cost is realized.

A first profile of the present invention to solve the problems explained above and to attain the object relates to a joining structure formed as explained below at the joining portion of a couple of members to be joined with each other. One member is provided with a belt type flat surface portion, while the other member is provided with an opposite flat surface portion opposing to the relevant belt type flat surface portion. Both flat surface portions are joined with each other via a plurality of plate springs. A plurality of plate springs are provided along the longitudinal direction of the belt type flat surface portion. Moreover, a plurality of plate springs are directed diagonally toward the longitudinal direction of the belt type flat surface portion.

According to the structure explained above, since each plate spring is diagonally directed toward the longitudinal direction of the belt type flat surface portion, a plurality of plate springs can be effectively allocated within a limited space of the belt type flat surface portion. Therefore, at least a requirement can be satisfied without opposition to the other requirements among requirements that the contact interval must be shortened, plate spring length must be elongated, and the width of the belt type flat surface portion must be narrowed. As a result, at least a requirement can be solved without opposition to the other requirements in regard to the three requirements that distribution of a plurality of plate springs should be dense along the longitudinal direction of the belt type flat surface portion, the plate spring itself should have higher elasticity, and reduction in cost should be realized.

Moreover, a second profile of the present invention is characterized in that a couple of members and plate springs to be joined with each other have conductivity in the joining structure of the first profile of the present invention.

According to the structure explained above, a couple of members have conductivity and are joined with each other via a plurality of conductive plate springs. Thereby, lead and entry of electromagnetic wave at the joining portion can be prevented. Namely, the joining structure of the present invention is formed as an electromagnetic shielding structure. Since each plate spring is directed diagonally toward the longitudinal direction of the belt type flat surface portion, a plurality of plate springs can be allocated effectively within the limited space of the belt type flat surface portion. Therefore, at least a requirement can be satisfied without opposition to the other requirements among the three requirements for the electromagnetic shielding structure, namely, contact internal should be shortened, the plate spring length should be elongated, and the width of the belt type flat surface portion should be narrowed. As a result, at least a requirement can be satisfied without opposition to the other requirements among the three requirements that the shielding performance for the high frequency electromagnetic wave should be improved, reliability of conductivity of the conductive members should be reliably improved, and reduction in cost should also be realized.

Moreover, a third profile of the present invention is characterized in that the belt type flat surface portion or the opposing flat surface portion is formed of a flat metal plate and a plurality of plate springs are formed by cutting and erecting the belt type flat surface portion or the opposing flat surface portion in the joining structure as the second profile of the present invention.

According to the structure explained above, a plurality of plate springs are integrated with the belt type flat surface portion or the opposing flat surface portion. Therefore, the number of components can be reduced.

Moreover, a fourth profile of the present invention is characterized in that an angle formed by the direction of each plate spring and the longitudinal direction of the belt type flat surface portion is equal to 25° or larger but equal to 65° or smaller in the joining structure as the first or second profile of the present invention.

According to the structure explained above, the plate spring length can elongated by about 10%, under the condition that the contact interval and the width of the belt type flat surface portion are constant, in comparison with that when each plate spring is parallel or vertical to the longitudinal direction of the belt type flat surface portion.

Moreover, a fifth profile of the present invention is characterized in that a couple of members are maintained in the joining condition through engagement of a first engaging portion provided to the belt type flat surface portion and a second engaging portion provided to the opposing flat surface portion in the joining structure of the first or second profile of the present invention.

According to the structure explained above, a component or maintaining the joining condition of a couple of members is no longer required because the joining condition of a couple of members can be maintained by engagement between the first engaging portion and the second engaging portion provided to the belt type flat surface portion and the opposing flat surface portion. Accordingly, the number of components can be reduced.

Moreover, a sixth profile of the present invention is characterized in that a couple of members are used to form a housing of an electronic device in the joining structure of the first or second profile of the present invention.

Moreover, a seventh profile of the present invention has the following structure in the joining structure of the sixth profile of the present invention. One of a couple of members is a housing body including an aperture having almost the U-shape cross-section, while the other is a cover closing the aperture. The belt type flat surface portion is provided any one of the circumference portion of the aperture of the housing body or the end portion of the cover and the opposing flat surface portion is provided to the other of them.

Moreover, a eighth profile of the present invention is characterized in that the belt type flat surface portion is formed by folding the circumference portion of the aperture of the housing body or the end portion of the cover in the joining structure of the seventh profile of the present invention.

BEST MODE FOR CARRYING OUT THE INVENTION

A preferred embodiment of a joining structure of the present invention will be explained below in detail with reference to the accompanying drawings.

Figure 1:
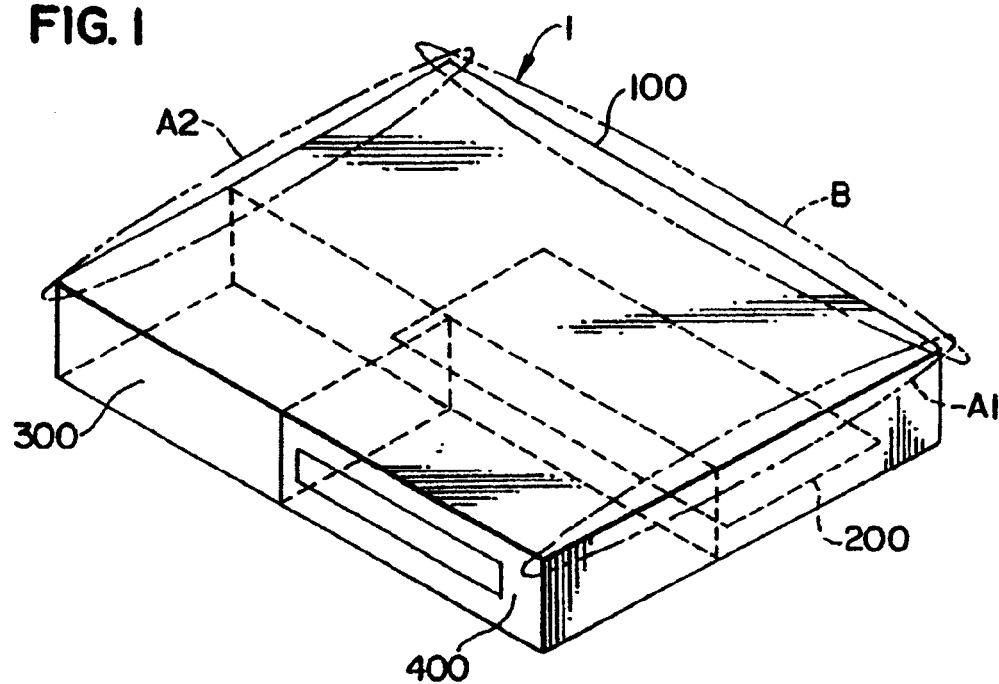
FIG. 1 is a de-assembled perspective view of a computer utilizing a joining structure of the present invention.
Figure 2:
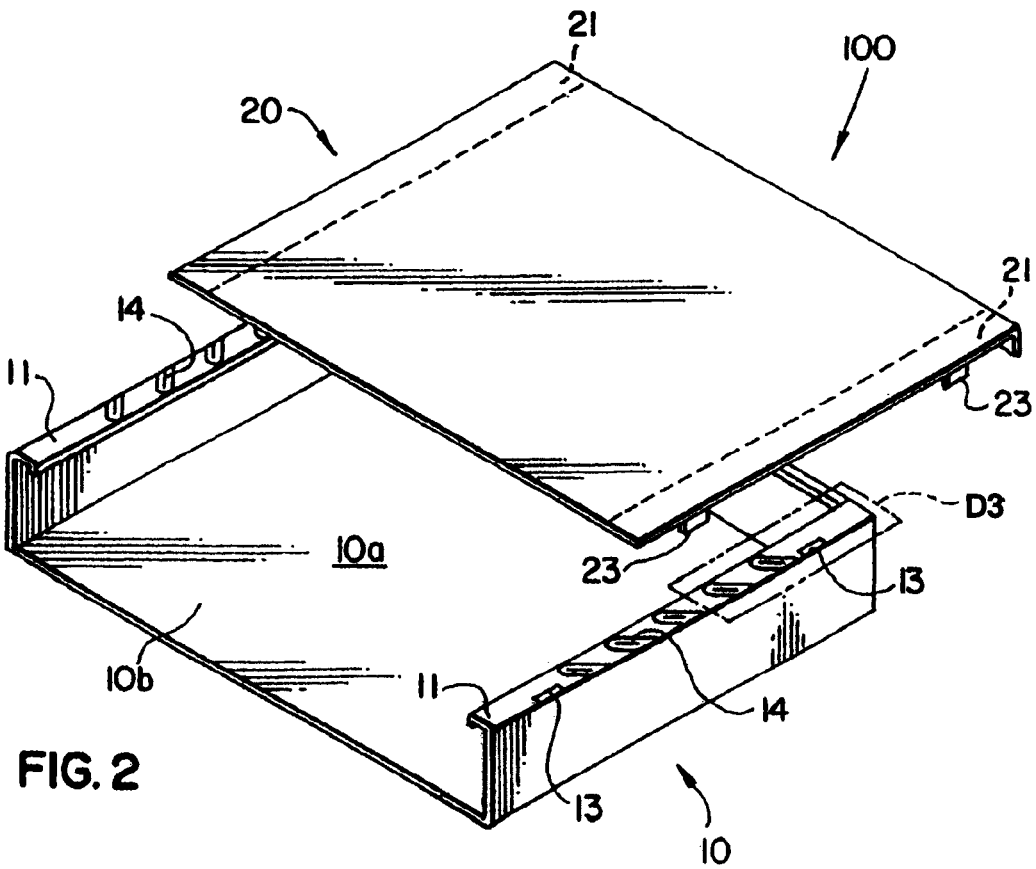
FIG. 2 is a de-assembled perspective view of a housing 100 of the computer 1 as an embodiment of the present invention.

FIG. 1 is a de-assembled perspective view of a computer utilizing a joining structure of the present invention. FIG. 1, the computer 1 is provided with a mother board 200 on which a CPU and a memory or the like are mounted, a hard disk drive 300, a CD-ROM drive 400, and a metal box type housing 100 for accommodating these units. The housing 100 is formed, as illustrated in FIG. 2, of a housing body 10 having almost U-shape cross-section including apertures 10a, 10b at the upper and front portions, and an almost rectangular ceiling plate 20 as a cover. The mother board 200 is installed in the rear side of the bottom part of the housing body 10. The hard disk drive 300 and CD-ROM drive 400 are installed in the front side of the housing body 10 and the aperture 10 in the front side is closed with these units. In the aperture 10a at the upper side of the housing body 10, the ceiling plate 20 is joined with the upper surface of the housing body 10.

In view of preventing leak and entry of the electromagnetic wave from the joining portions between the housing body 10 and the ceiling plate 20, the joining structure of the present invention has been adapted. In more detail, the joining structure of the present invention is adapted to the three portions of the joining portion A1 in the upper right side, joining portion A2 in the upper left side, and joining portion B in the rear upper side.

Figure 3:
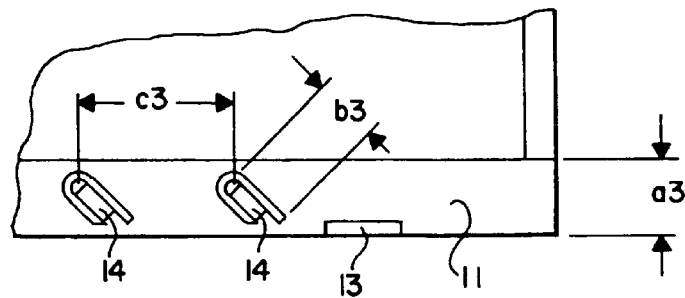
FIG. 3 is an enlarged plan view of a part C3 in FIG. 2.
Figure 4:
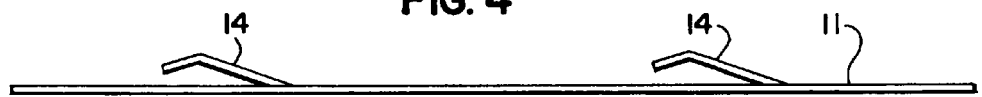
FIG. 4 is an enlarged side elevation of the part C in FIG. 2.

The structure of joining portion between the housing body 10 and the ceiling plate 20 will be explained below. First, a structure of the joining portion A1 in the upper right side will be explained. Structure of the joining portion A2 is similar to that of the joining portion a1 and therefore explanation of the joining portion A2 will be omitted. As illustrated in FIG. 2, the circumferential part in the right side of the aperture 10a at the upper part of the housing body 10 is provided with the belt type flat surface portion 11 for receiving the ceiling plate 20. In more practical, the belt type flat surface portion 11 is formed, almost in the narrow elongated rectangular shape, by folding the end portion of the right side surface of the housing body 10 almost at the right angle toward the aperture 10a. Meanwhile, the ceiling plate 20 is provided with the belt type opposing flat surface portion 21 opposing to the belt type flat surface portion 11. In this embodiment, a part corresponding to the belt type flat surface portion 11 among the ceiling plate 20 is formed as the opposing flat surface portion 21. An almost L-shape engaging projected-portion 23 is provided in both sides of the longitudinal directions of the opposing flat surface portion 21. Therefore, an engaging groove 13 is provided, corresponding to such projected-portion, in both sides of the longitudinal directions of the belt type flat surface portion 11. Moreover, between the belt type flat surface portion 11 and the opposing flat surface portion 21, a plurality of plate springs 14 are provided along the longitudinal direction of the belt type flat surface portion 11. These plate springs 14 are provided between the portions where the engaging projected-portion 23 is engaged with the engaging groove 13. FIG. 3 and FIG. 4 are respectively enlarged flat view and the enlarged side elevation of the part D3 in FIG. 2. As illustrated in FIG. 3 and FIG. 4, in this embodiment, each plate spring 14 is formed by cutting and erecting the belt type flat surface portion 11 in almost the U-shape. Moreover, from the viewpoint of the safety, the free end of each plate spring 14 is folded toward internal side. Therefore, each plate spring 14 is in contact with the ceiling plate 20 at the area near the top of the same.

The joining sequence at the joining portion 1A having the structure explained above will be explained below. First, the opposing flat surface portion 21 of the ceiling plate 20 is provided opposing to the belt type flat surface portion 11 of the housing body 10 and a couple of engaging projected-portions 23 are inserted into the corresponding engaging groove 13. In this timing, a plurality of plate springs 14 are pushed with the opposing flat surface portion 21 of the ceiling plate 20 to generate a repulsive elastic force. Next, the ceiling plate 20 is slid toward the end portion of the engaging projected-portion 23 for engagement between the engaging projected-portion 23 and the engaging groove 13. This engaging condition is surely maintained because the engaging projected-portion 23 is depressed to the lower side of the belt type flat surface portion 11 with the repulsive elastic force of a plurality of plate springs 14. Moreover, a plurality of plate springs 14 are in contact elastically with the opposing flat surface portion 21. Since the belt type flat surface portion 11 and the opposing flat surface portion 21 are joined via a plurality of plate springs 14 as explained above, a plurality of plate springs 14 and the opposing flat surface portion 21 are joined conductively via the contacts thereof. Accordingly, leak and entry of the electromagnetic wave from the joining portion A1 can be prevented.

Figure 5:
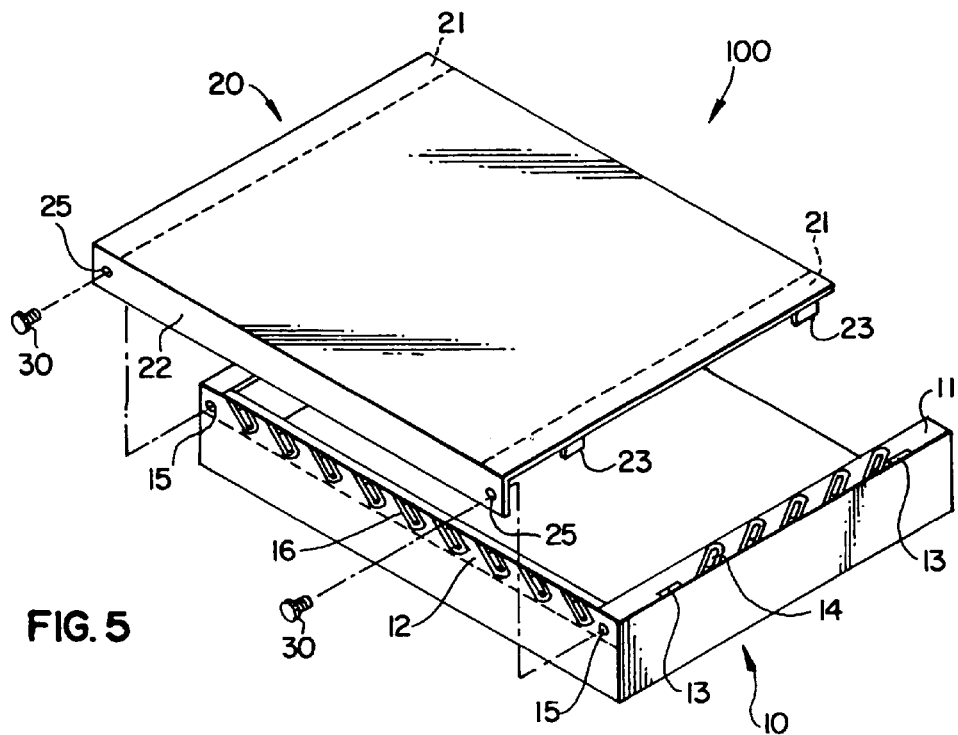
FIG. 5 is a de-assembled perspective view observed from the rear surface of the housing 100 of the computer 1 as the embodiment.

Next, structure of the joining portion B in the upper part of the rear surface. FIG. 5 is a de-assembled perspective view observed from the rear surface of the computer of this embodiment. As illustrated in FIG. 5, the rear end part of the ceiling plate 20 is provided with the belt type flat surface portion 22 for butting the ceiling plate 20 and housing body 10. In more practical, the belt type flat surface portion 22 is formed by folding the rear end part of the ceiling plate 20 almost in the narrow rectangular shape. On the other hand, the housing body 10 is provided with the belt type opposing flat surface portion 12 opposing to this belt type flat surface portion 22. In this embodiment, a part of the rear surface of the housing body 10 corresponding to the belt type flat surface portion 22 is formed as the opposing flat surface portion 12. Screw holes 15 are provided in both sides of the longitudinal direction of this opposing flat surface portion 12 and the screw holes 25 are also provided, corresponding to above screw holes, in both sides of the longitudinal direction of the bent type flat surface portion 22. In addition, a plurality of plate springs 16 are provided along the longitudinal direction of the belt type flat surface portion 22 between the belt type flat surface portion 22 and the opposing flat surface portion 12. Each plate spring 16 is formed by cutting and erecting the opposing flat surface portion 12 in the shape similar to the joining portion A1.

Joining sequence at the joining portion B having the structure explained above will then be explained. First, the belt type flat surface portion 22 of the ceiling plate 20 is provided opposing to the opposing flat surface portion 12 of the housing body 10 with two screw holes 15, 25 aligned with each other. Next, a couple of screws 30 are inserted into the screw holes 15, 25 and these screws are tightened for coupling the bent type flat surface portion 22 and the opposing flat surface portion 12. In this case, a plurality of ceiling plates 16 are pressed with the belt type flat surface portion 22 of the ceiling plate 20 to generate a repulsive elastic force. With this repulsive elastic force, loosening of the tightened screws can be prevented. Moreover, a plurality of plate springs 16 are elastically in contact with the belt type flat surface portion 22. Since the belt type flat surface portion 22 and the opposing flat surface portion 12 are joined with each other via a plurality of plate springs 16 as explained above, a plurality of plate springs 16 and the belt type flat surface portion 22 are coupled conductively through the contacts thereof. Accordingly, leak and entry of electromagnetic wave from the joining portion B can be prevented.

Allocation of a plurality of plate springs 14 at the joining portion A1 will be explained below in detail. In FIG. 3, the plate springs 14 are allocated, within the width a3 of the belt type flat surface portion 11, along the longitudinal direction of the belt type flat surface portion 11 in the contact interval c3. Here, from point of view of reduction in size and cost of the housing 100, narrow width a3 of the belt type flat surface portion 11 is more desirable. Moreover, longer plate spring length b3 is desirable to realize more reliable conductivity between the plate spring 14 and ceiling plate 20. In addition, shorter contact interval c3 is more desirable from the viewpoint of shielding the high frequency electromagnetic wave. Accordingly, it is more desirable to allocate a plurality of plate springs 14 with better space efficiency to the belt type flat surface portion 11. Therefore, in this embodiment, each plate spring 14 is directed diagonally to the longitudinal direction of the belt type flat surface portion 11 as illustrated in FIG. 3. This is also adapted to the joining portions A2 and B.

Figure 6:
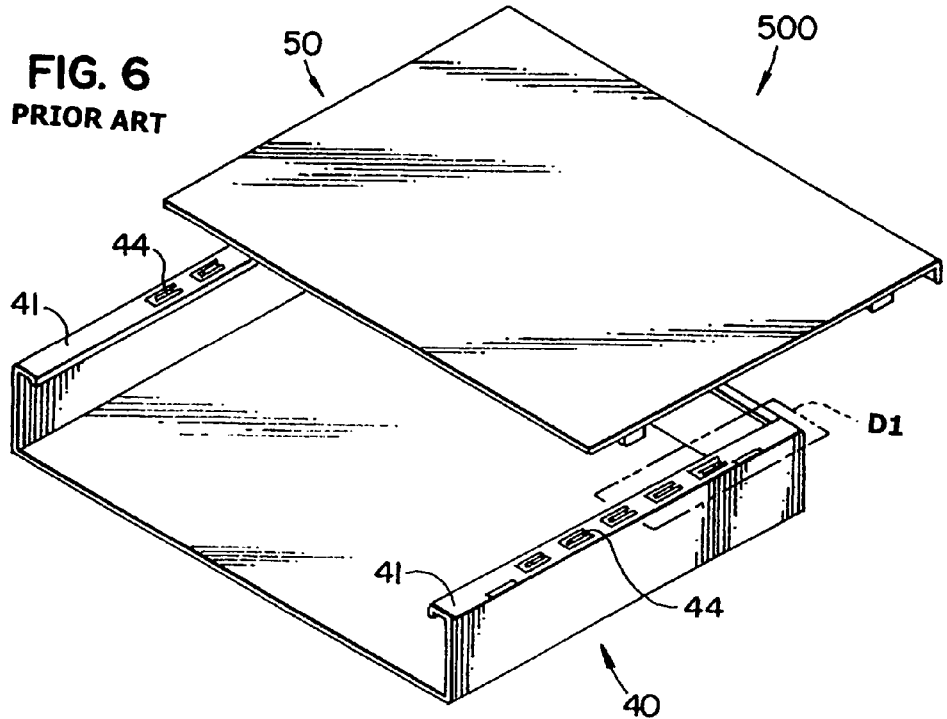
FIG. 6 is a de-assembled perspective view of the housing including the electromagnetic shielding structure of the background art.
Figure 8:
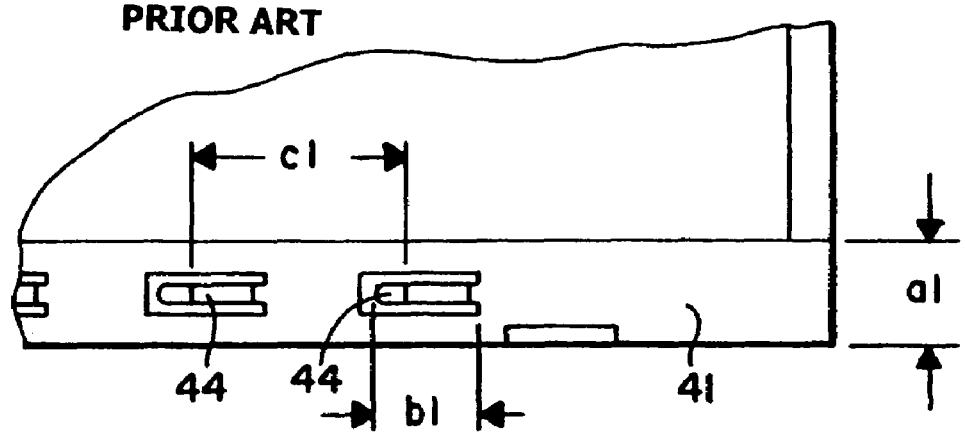
FIG. 8 is an enlarged plan view of the part C1 in FIG. 6.

Allocation of plate spring in this embodiment will be compared with the allocation thereof in which the plate spring is directed in parallel to the longitudinal direction of the belt type flat surface portion (allocation illustrated in FIG. 6 and FIG. 8). An angle formed by the longitudinal direction of the belt type flat surface portion 11 and the direction of the plate spring 14 is defined as $\theta$ ($0°<\theta<90°$) and the widths a1, a3 of the belt type flat surface portion are assumed to be equal to the contact intervals c1, c3. In this case, the relationship between the plate spring lengths b1 and b3 is indicated as $b3=b1/\cos\theta$. Namely, when the direction of plate spring is changed to the diagonal direction inclined by the angle $\theta$ from the parallel direction, length of the plate spring can be increased by ($1/\cos\theta$) times without change of the width of the belt type flat surface portion and the contact interval. Here, the result ($1/\cos\theta$)>1 can be attained because of $0°<\theta<90°$. In more practical, when the direction of plate spring is inclined in the angle of 25° ($\theta=25°$), the plate spring length can elongated by 10%, while when the direction is inclined in the angle of 40° ($\theta=40°$), the plate spring length can be elongated by 30%.

Figure 7:
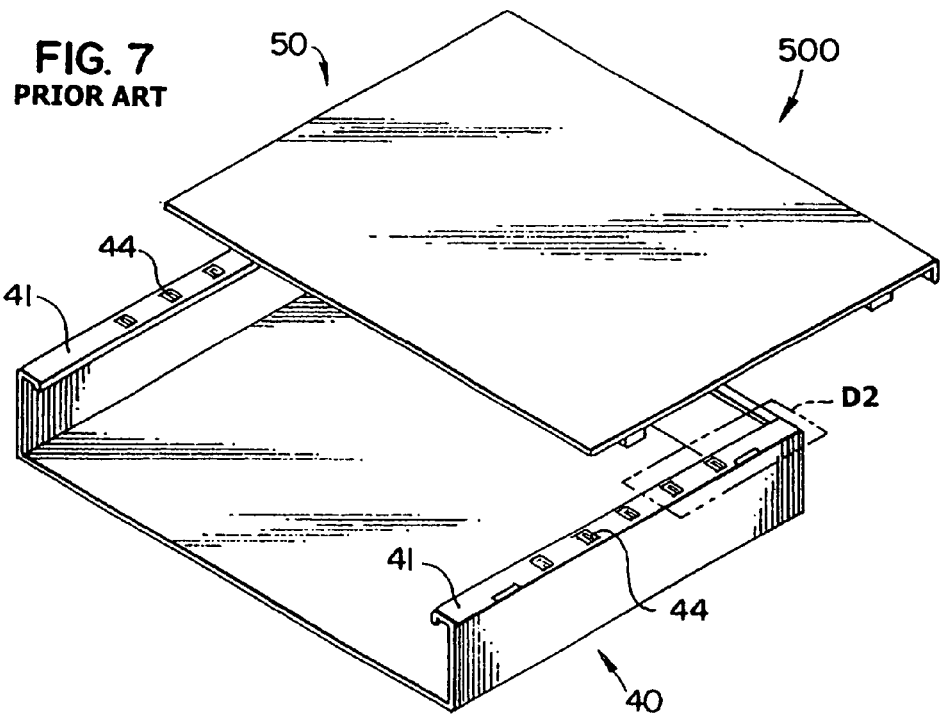
FIG. 7 is a de-assembled perspective view of the housing of the electromagnetic shielding structure of the background art.
Figure 9:
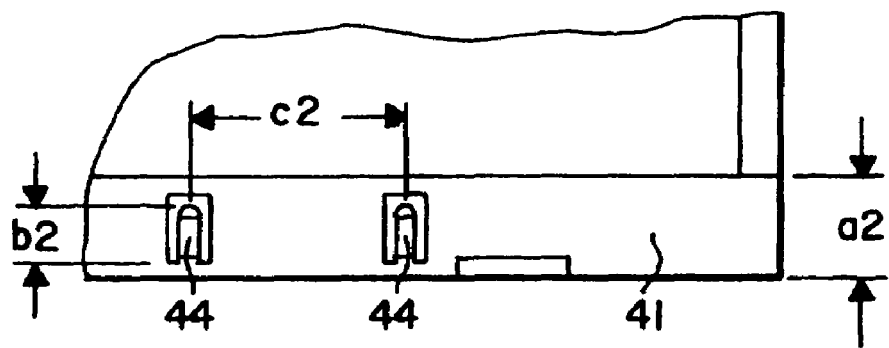
FIG. 9 is an enlarged plan view of the part C2 in FIG. 7.

Next, allocation of the plate spring in this embodiment is compared with the allocation (illustrated in FIG. 7 and FIG. 9) where the plate spring is directed vertically to the longitudinal direction of the belt type flat surface portion. Here, the angle formed by the longitudinal direction of the belt type flat surface portion 11 and the direction of the plate spring 14 is defined as $\theta$ ($0°<\theta<90°$), and the widths a2, a3 of the belt type flat surface portion and contact intervals c2, c3 are assumed to be identical with each other. In this case, the relationship between the plate spring lengths b2 and b3 is indicated as $b3=b2/\cos\Phi$ ($\Phi=90°-\theta$, $0°<\Phi<90°$). Namely, when the direction of plate spring is changed diagonally with the angle $\Phi$ from the vertical direction, the plate spring length can be elongated by ($1/\cos\Phi$) times without change in the width of the belt type flat surface portion and the contact interval. Here, the result ($1/\cos\theta$)>1 can be obtained because of $0°<\Phi<90°$. In more practical, when $\Phi=25°$ ($\theta=65°$), the plate spring length can be elongated by 10% and when $\Phi=40°$ ($\theta=50°$), the plate spring length can be elongated by 30%.

From above explanation, the angle formed by the direction of the plate spring 14 and by the longitudinal direction of the belt type flat surface portion 11 is desirably equal to 25° or more but is equal to 65° or less and the more desirable angle is equal to 40° or more but is equal to 50° or less.

As explained above, according to the embodiment of the present invention, since each plate spring 14, 16 is directed diagonally to the longitudinal direction of the belt type flat surface portion 11, 22, a plurality of plate springs 14, 16 can be effectively allocated within the limited space of the belt type flat surface portion 11, 12. Therefore, at least one requirement can be satisfied without opposing to the other requirements among the requirements that the contact interval should be shortened, the plate spring length should be elongated, and the width of belt type flat surface portion should be narrowed. As a result, at least a requirement can be satisfied, from the viewpoint of the electromagnetic shield, without opposing to the other requirements among the three requirements for reliable improvement in the shielding performance for high frequency electromagnetic wave, reliable improvement in conductivity of the housing body 10 and the ceiling plate 20, and reduction in cost. Meanwhile, from the viewpoint of close contact, at least a requirement can be satisfied, without opposition to the other requirements, for three requirements for dense distribution of a plurality of plate springs 14, 16 in the longitudinal direction of the belt type flat surface portions 11, 22, high elasticity of the plate spring itself, and reduction in cost.

Moreover, since a plurality of plate springs 14, 16 are formed by cutting and erecting the belt type flat surface portion 11 and opposing flat surface portion 12, the belt type flat surface portion 11 or opposing flat surface portion 12 and a plurality of plate sprints 14, 16 can be integrated. Accordingly, it is no longer required to provide a plate spring as an additional component, and thereby the number of components can be reduced. In addition, since assembling of the ceiling plate 20 to the housing body 10 can be simplified, the assembling and maintenance can also be simplified. As a result, reduction in cost can surely be realized.

Moreover, since the engaging projected-portion 23 is provided to the opposing flat surface portion 21 and the engaging groove 13 is also provided to the belt type flat surface portion 11 in the joining portions A1, A2, it is not required to additionally provide a component for maintaining the joining condition between the housing body 10 and the ceiling plate 20. Therefore, the number of components can be reduced, assembling of the ceiling plate 20 to the housing body 10 can be simplified, and thereby assembling and maintenance can be simplified. As a result, reduction in cost can also be realized.

The present invention is not limited to the embodiment explained above. For example, in the embodiment explained above, the metallic housing body 10 and the metallic ceiling plate 20 have been used as a couple members to be joined with each other. However, quality and shape of such members are not limited to that explained above. The joining structure in the present invention can also be adapted to the other desired members such as conductive plastic panel or the like.

Moreover, in this embodiment, the joining structure in the present invention has been adapted as the electromagnetic shielding structure. However, the present invention can also be widely applied to the joining portion of a couple of members. Accordingly, a couple of members to be joined with each other and a plurality of plate springs may be insulating members or plate springs.

In addition, the belt type flat surface portions 11, 22 and opposing flat surface portions 12, 21 are not required to be the perfectly flat surface portions. Namely, these flat surface portions are allowed to include unevenness or hole of a certain degree or are also allowed to be curved to a certain degree, when these have the flat surface in such a degree as realizing mutual joining.

Moreover, in this embodiment, the belt type flat surface portion is formed by folding the side surface of the housing body 10 or the rear end part of the ceiling plate 20, but the present invention is not limited thereto. For example, when it is possible to form the other conductive member and belt type joining portion, the other desired profile can also be employed.

In addition, in this embodiment, those formed by cutting and erecting the belt type flat surface portion 11 or the opposing flat surface portion 12 are used as a plurality of plate springs. But, the present invention is not limited thereto and it is also possible to provide, as the other component, a plurality of plate springs or a plate or the like where a plurality of plate springs are integrated. In addition, quality and shape of the plate spring are not restricted in this embodiment.

Moreover, in this embodiment, an almost L-shape engaging projected-portion 23 and an engaging groove 13 have been used as the first engaging portion and the second engaging portion. But, the present invention is never limited thereto. When it is possible to maintain the joining conditions of a couple of members by mutual engagement, the desired engaging member can also be employed. Further, as a means for maintaining the joining condition of a couple of members, the desired means such as riveting or spot welding or the like can also be introduced.

What is claimed is:

1. A joining structure at a joining portion of a couple of members to be joined with each other, comprising:
    a belt type flat surface portion provided to one member,
    an opposing flat surface portion provided to the other member opposing to said belt type flat surface portion, and
    a plurality of plate springs provided along the longitudinal direction of said belt type flat surface portion between said opposing flat surface portion and said belt type flat surface portion,
    wherein said each plate spring is directed diagonally to the longitudinal direction of said belt type flat surface portion having an angle equal to 25° or more and equal to 65° or less,
    said belt type flat surface portion and said opposing flat surface portion are joined with each other via a plurality of said plate springs, and
    wherein each of said plate springs includes:
    a first linear portion extending away from said belt type flat surface portion; and
    a second linear portion extending toward said belt type flat surface portion and having a length that is shorter than the first linear portion,
    wherein said each plate spring is directed diagonally outward to the longitudinal direction of said belt type flat surface portion from an outer side of a portion of a housing body for accommodating electronic components of the belt type flat surface portion from a front side of the housing body to a rear side of the housing body.

2. The joining structure according to claim 1, characterized in that a couple of said members and said plate spring are conductive.

3. The joining structure according to claim 2, characterized in that said belt type flat surface portion or said opposing flat surface portion is formed as a metal flat plate and a plurality of said plate springs are formed by cutting and erecting said belt type flat surface portion or said opposing flat surface portion.

4. The joining structure according to claim 1 or 2, characterized in that a first engaging portion provided to said belt type flat surface portion and a second engaging portion provided to said opposing flat surface portion are provided and the joining condition of said couple of members can be maintained by mutual engagement between said first engaging portion and the second engaging portion.

5. The joining structure according to claim 1 or 2, characterized in that said couple of members are used to form a housing of an electronic device.

6. The joining structure according to claim 5, characterized in that
    one of said couple of members is said housing body in almost U-shaped cross-section having an aperture and the other thereof is a cover closing said aperture, and
    said belt type flat surface portion is provided to any of the circumferential portion of an aperture of said housing body or the end portion of said cover and said opposing flat surface portion is provided to the other thereof.

7. The joining structure according to claim 6, characterized in that said belt type flat surface portion is formed by folding the circumferential portion of the aperture of said housing body or the end portion of said cover.

8. A computer, comprising:
    electronic components;
    a housing body comprising a belt type flat surface portion and accommodating the electronic components;
    a ceiling plate comprising an opposing flat surface portion opposing to said belt type flat surface portion, and
    a plurality of plate springs provided along the longitudinal direction of said belt type flat surface portion between said opposing flat surface portion and said belt type flat surface portion,
    wherein said each plate spring is directed diagonally outward to the longitudinal direction of said belt type flat surface portion from an outer side portion of the housing body for accommodating the electronic components of the belt type flat surface portion from a front side of the housing body to a rear side of the housing body,
    said belt type flat surface portion and said opposing flat surface portion are joined with each other via a plurality of said plate springs, and
    wherein each of said plate springs includes;
    a first linear portion extending away from said belt type flat surface portion; and
    a second linear portion extending toward said belt type flat surface portion and having a length that is shorter than the first linear portion.

9. A computer, comprising:

electronic components;

a housing body comprising a belt type flat surface portion and accommodating the electronic components;

a ceiling plate comprising an opposing flat surface portion opposing to said belt type flat surface portion, and a plurality of plate springs provided along the longitudinal direction of said belt type flat surface portion between said opposing flat surface portion and said belt type flat surface portion, wherein said each plate spring is directed diagonally to the longitudinal direction of said belt type flat surface portion having an angle equal to 25° or more and equal to 65° or less, said belt type flat surface portion and said opposing flat surface portion are joined with each other via a plurality of said plate springs, and wherein each of said plate springs includes:

a first linear portion extending away from said belt type flat surface portion; and a second linear portion extending toward said belt type flat surface portion and having a length that is shorter than the first linear portion, wherein said each plate spring is directed diagonally outward to the longitudinal direction of said belt type flat surface portion from an outer side portion of the housing body for accommodating the electronic components of the belt type flat surface portion from a front side of the housing body to a rear side of the housing body.

10. The computer according to claim 9, wherein said housing body, said ceiling plate and said plate spring are conductive.

11. The computer according to claim 9, wherein said belt type flat surface portion or said opposing flat surface portion is formed as a metal flat plate and a plurality of said plate springs are formed by cutting and erecting said belt type flat surface portion or said opposing flat surface portion.

12. The computer according to claim 9, wherein said belt type flat surface portion comprises a first engaging portion, said opposing flat surface portion comprises a second engaging portion, and the joining condition between said housing body and said ceiling plate is maintained by mutual engagement between said first engaging portion and said second engaging portion.

13. The computer according to claim 9, wherein said housing body is formed almost as a U-shaped cross-section having an aperture and said ceiling plate is a cover for closing said aperture, and said belt type flat surface portion is provided to the circumferential portion of an aperture of said housing body and said opposing flat surface portion is provided to end portion of said cover.

14. The computer according to claim 13, wherein said belt type flat surface portion is formed by folding the circumferential portion of the aperture of said housing body.

* * * * *